United States Patent [19]
Hwang et al.

[11] Patent Number: 5,731,599
[45] Date of Patent: Mar. 24, 1998

[54] BLUE LIGHT-EMITTING POLYMER AND LIGHT-EMITTING DIODE ADOPTING THE SAME

[76] Inventors: Do-hoon Hwang, Department of Chemistry, Korea Advanced Institute of Science and Technology, 371-1 Kusung-dong, Yusung-gu; Hong-ku Shim, 132-1302 Hanbit Apt., Eoeun-dong, Yusung-gu, both of Daejeon-city, Chungcheongnam-do; Dong-sik Sakong, 115-802 Shibeommaeul Hanshin Apt., Seohyun-dong, Bundang-ku, Sungnam-city, Kyungki-do, all of Rep. of Korea

[21] Appl. No.: 562,025

[22] Filed: Nov. 22, 1995

[30] Foreign Application Priority Data

Jul. 31, 1995 [KR] Rep. of Korea ............... 95-23528

[51] Int. Cl.$^6$ .................... H01L 35/24; H01L 51/00
[52] U.S. Cl. .................................. 257/40; 257/103
[58] Field of Search .................................. 257/103, 40

[56] References Cited

U.S. PATENT DOCUMENTS

| | | | |
|---|---|---|---|
| 5,220,181 | 6/1993 | Kanai et al. | 257/40 |
| 5,247,190 | 9/1993 | Friend et al. | |
| 5,514,878 | 5/1996 | Holmes et al. | 257/40 |
| 5,543,079 | 8/1996 | Ohnishi et al. | 257/40 |

FOREIGN PATENT DOCUMENTS

| | | |
|---|---|---|
| 5-320635 | 12/1993 | Japan. |
| WO 92/16023 | 9/1992 | WIPO. |

OTHER PUBLICATIONS

Do–hoon Hwang et al., "Synthesis and Characterization of Blue Light–Emitting Polymers Containing Phenylenevinylene Units", Bull. Korean Chem. Soc., 1995, vol. 16, No. 2, pp. 135–138.

Do–hoon Hwang, "A Thesis for a Doctorate—Synthesis, and Electrical, Nonlinear Optical and Luminescent Properties of Novel Poly(1,4–phenylenevinylene) Derivatives", Dept. of Chem., Korea Advanced Institute of Science and Technology, 1995.

*Primary Examiner*—Jerome Jackson
*Attorney, Agent, or Firm*—Burns, Doane, Swecker & Mathis, L.L.P.

[57] ABSTRACT

There are disclosed a blue light-emitting polymer and a light-emitting diode adopting the same. A conjugated polymer having phenylene residues substituted by a silicon-containing group in a main chain have blue light-emitting properties and a good solubility in organic solvent. Therefore, a light-emitting diode having an anode and a cathode on both sides of the conjugated polymer layer, respectively is capable of showing extended emission in the blue region and has an excellent light-emitting efficiency.

7 Claims, 2 Drawing Sheets

BLUE LIGHT-EMITTING POLYMER AND LIGHT-EMITTING DIODE ADOPTING THE SAME

BACKGROUND OF THE INVENTION

The present invention relates to a blue light-emitting polymer and a light-emitting diode adopting the same, and more particularly, to a blue light-emitting polymer and a light-emitting diode adopting the same which is capable of extended emission in the blue region and has an excellent light-emitting efficiency.

As a conjugated polymer has nonlinear optical, light-emitting and certain electrical properties, is inexpensive and can be processed with ease when compared to metal or semiconductor material, it is very useful for the electronics industry.

However, most of the existing conjugated polymers have poor solubility. To increase the solubility, a spacer group consisting of alkylene residues in a main chain is lengthened, which deteriorates a mechanical properties. Accordingly, there is active study on the development of a conductive polymer having a good processibility as well as electrical conductivity, a nonlinear optical response characteristic and light-emitting properties.

Meanwhile, a liquid crystal display (LCD) is now widely used owing to its advantages of low power consumption and light weight. Large-scale color LCDs, however, are difficult to manufacture. This limitation of the use of LCDs accelerates interest in a display unit adopting a light-emitting diode (LED). As the display unit adopting the LED has better response and contrast than a light-accepting type LCD, there has been recent anticipation that cathode-ray tubes and planar LCD panels may be substituted by LED displays.

Besides their relatively high power consumption, most of the currently used LEDs which are formed of inorganic crystals fail in realizing large screens and require a high driving voltage. Also, it is difficult to obtain LEDs which emit light in the green and blue regions.

Therefore, to overcome the aforementioned limitations of the inorganic crystal, organic polymers which can be used as materials of the LED have been extensively studied. The result of one such study is disclosed in U.S. Pat. No. 5,247,190. Here, the polymer used for the light-emitting layer was poly(1,4-phenylene vinylene) (PPV) having a conjugated double bond and represented as following formula (I):

PPV, a conjugated polymer emits light in the green region of a wavelength of 540 nm and indicates a light-emitting efficiency of 0.01% when aluminum and indium tin oxide (ITO) are used as the cathode and anode, respectively.

With continued studies of PPV and derivatives thereof (see WO9216023) and the development of a variety of electrodes and a novel light-emitting layer, light emitting efficiency is improved up to about 4%. However, such PPV and their derivatives cannot emit light below the green region because they have fully conjugated double bonds.

To overcome the above disadvantages, the development of a blue light-emitting polymer has resulted in polyparaphenylene (PPP) showing emission in the blue region below 459 nm and polyalkylflorene showing emission in the blue region of 470 nm. PPP and polyalkylflorene, however, are difficult to synthesize, deteriorate the film quality and processibility, and have a very short life span of emission.

Meanwhile, a blue-emitting polymer having conjugated double bond units consisting of phenylene vinylene residues is represented as follows:

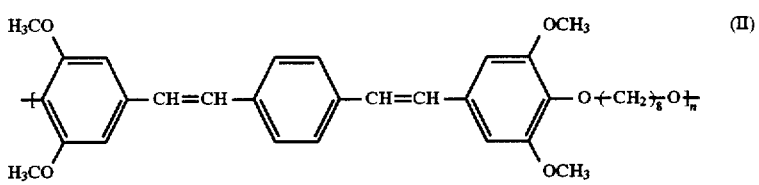

The polymer represented as formula (II) has been shown to be dissolved in an organic solvent and to exhibit excellent processibility and film quality. However, when the polymer is adopted as a light-emitting material, the spacer group added thereto is lengthened to increase the solubility, which leads to the deterioration of the mechanical properties of PPV.

Also, a synthetic method for forming a bluish green and blue light-emitting polymer represented as following formula (III) is disclosed in Japanese Patent Laid-open No. 5-320635.

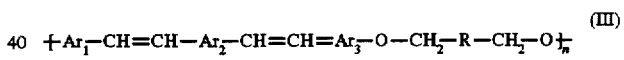

The major moiety of the polymer (III) is $Ar_2$ unit which is phenylene having symmetrically substituted alkoxy groups. The alkoxy group, a strong electron donating group, increases the absorption wavelength of the polymer, whereby the light-emitting wavelength increases accordingly. Thus, the light-emitting wavelength of the polymer having alkoxy group substituents is located in the greenish blue region ranging from 520 nm to 530 nm.

Meanwhile, when the $Ar_2$ unit is phenyl, naphthalene or biphenyl, the light-emitting wave length decreases. However, the solubility of the polymer becomes poor.

On the other hand, if the spacer group is lengthened to increase the solubility of the polymer, the life span of the film is shortened because of its deteriorated heat stability. Therefore, there is an ever-increasing requirement for a blue light-emitting polymer having good solubility in an organic solvent.

FIG. 1 is a schematic view showing a conventional light-emitting diode. Generally, to manufacture the conventional light-emitting diode, a positive electrode (anode) 2 is formed on a substrate 1 by thermal deposition, and a thin polymeric film 3 and a negative electrode (cathode) 4 are sequentially formed thereon. For the formation of the polymeric film, a polymeric material or a polymeric precursor is dissolved in a solvent and the solution is spin-coated. Here, when the solubility of the polymeric material or precursor is poor, not only is the formation of the polymeric film difficult, but the finished polymer film exhibits poor light-emitting efficiency.

FIG. 2 is a schematic diagram showing a light-emitting process when an electrical field is applied to the light-emitting diode of FIG. 1. Referring to FIG. 2, when the electrical field is applied via the respective electrodes shown in FIG. 1, a polaron ($p^-$, $p^+$) electrically charged by the structural relaxation of the polymeric chain is generated and forms a polaron-exciton. Thereafter, the polaron-exciton, while recombining, quickly produces light-emission.

In the case of using the polymer having a poor solubility, a defect is created in the polymeric film during the processing, which leads no the deterioration of the light-emitting efficiency of the polymer. Thus, the light-emitting diode adopting the polymer with poor solubility has poor light-emitting efficiency.

SUMMARY OF THE INVENTION

An object of the present invention is to provide a blue light-emitting polymer which shows extended emission in the blue region and exhibits excellent processibility.

Another object of the present invention is to provide a blue light-emitting diode which shows emission in blue region for a long time and has an excellent light-emitting efficiency.

To achieve the first object of the present invention, there is provided a blue light-emitting polymer represented as following formula (IV):

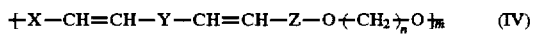
$$\text{+X—CH=CH—Y—CH=CH—Z—O+CH}_2\text{)}_n\text{O+}_m \qquad \text{(IV)}$$

wherein X is one selected from the group consisting of the following formulae (V) and (VI); Y is one selected from the group consisting of the following formulae (VII) and (VIII); Z is one selected from the group consisting of the following formulae (V) and (IX); n is 1–20; and m is 5–100.

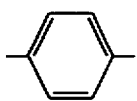
(V)

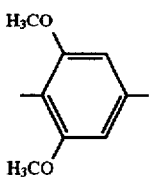
(VI)

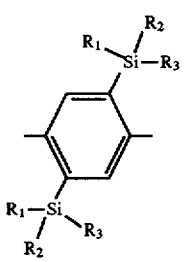
(VII)

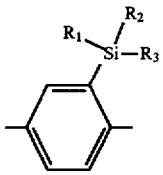
(VIII)

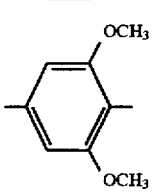
(IX)

where $R_1$, $R_2$ and $R_3$ are each a $C_1$–$C_8$ alkyl group.

It is preferred that n is 2–5 and that $R_1$, $R_2$ and $R_3$ are each a $C_1$–$C_4$ alkyl group.

To achieve the second object of the present invention, there is provided a blue light-emitting diode in which the electrode layers are formed on both sides of a conjugated polymeric layer, wherein the conjugated polymer is one represented as the above formula (IV).

In the present invention, a main chain of the polymer contains phenylene substituted by silicon-containing group. A silicon atom and a hydrogen atom have similar electrical characteristic in connection with electron donation or withdrawal, whereby the emission of the silicon-substituted polymer is blue-shifted, when compared to the alkoxy-substituted polymer. Unlike an unsubstituted polymer, the silicon-substituted polymer has good solubility in an organic solvent such as chloroform, dichloromethane, tetrahydrofuran or cyclohexanone, which results in forming a uniform polymeric thin film with few defects with ease. Also, the solubility thereof is still good, even with a short spacer group. Accordingly, polymer of the present invention has the mechanical strength and heat stability as good as those of the PPV.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, the present invention will be explained in detail with a preferable blue light-emitting polymer and a light-emitting diode adopting the same.

Synthesis of Monomers (1) Synthesis of 2,5-bis(trialkylsilyl)-1,4-xylenebis (triphenylphosphonium bromide) (X)

According to the following reaction, 2,5-bis trialkylsilyl) -1,4-bis(bromomethyl)benzene and triphenylphosphine are reacted in dimethylformamide (DMF), and precipitated in diethylether. After filtration and vacuum drying the precipitate, a white product, 2,5-bis(trialkyl silyl)-1,4-xylenebis(triphenylphosphonium bromide) (X) is obtained.

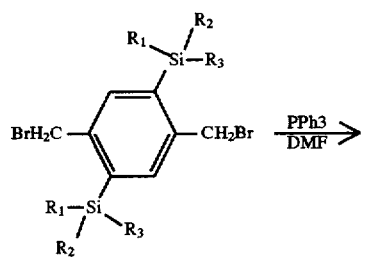

(2) Synthesis of 2-trialkylsilyl-1,4-xylenebis(triphenylphosphonium bromide) (XI)

According to the following reaction, 2-trialkylsilyl-1,4-bis(bromomethyl)benzene and triphenylphosphine are reacted in DMF, and precipitated in diethylether. After filtration and vacuum drying the precipitate, the white product (XI) is obtained.

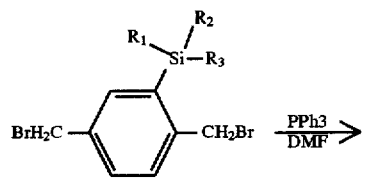

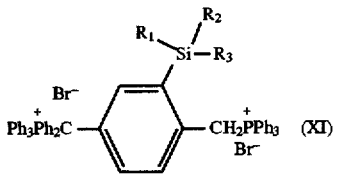

(3) Synthesis of 1,3-bis-(4-formyl-phenoxy) alkane (XII)

According to the following reaction, 4-hydroxybenzaldehyde and alkane in which both ends are substituted with a bromine atom (dibromoalkane) are reacted in potassium carbonate solution in DMF and precipitated by cooling. After filtration and vacuum drying, the precipitate is recrystallized in ethanol to obtain the white product (XII).

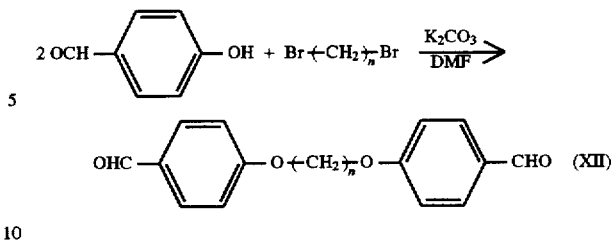

(4) Synthesis of 1,3-bis(4-formyl-2,6-dimethoxyphenoxy)alkane (XIII)

According to the following reaction, 4-hydroxybenzaldehyde and alkane in which both ends are substitute with a bromine atom (dibromoalkane) are reacted in potassium carbonate solution in DMF and precipitated by cooling. After filtration and vacuum drying, the precipitate is recrystallized in ethanol to obtain the white product (XIII).

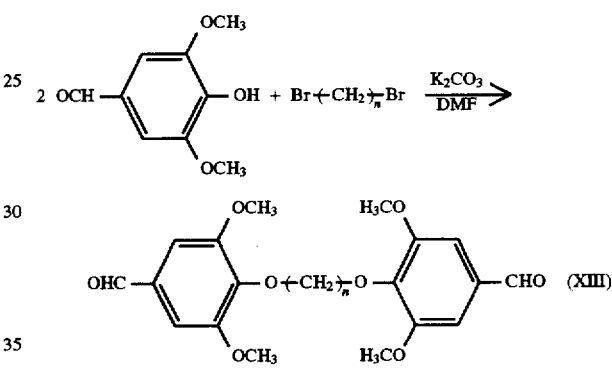

Synthesis of Polymeric Material (1) Synthesis of P-1

The same equivalent of monomers (X) and (XII) are thoroughly dissolved in ethanol and chloroform, and sodium ethoxide was added thereto in a slightly excessive amount. After reacting at a normal temperature, the product is extracted with chloroform and precipitated in methanol. The final product, polymer P-1 is obtained.

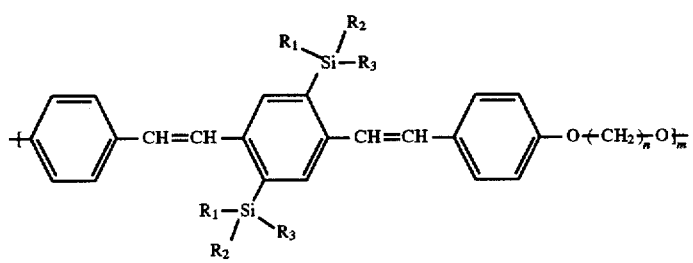

(2) Synthesis of P-2

Using the same equivalent of monomers (XI) and (XII), the same processes as in (1) are repeated to obtain the final product P-2.

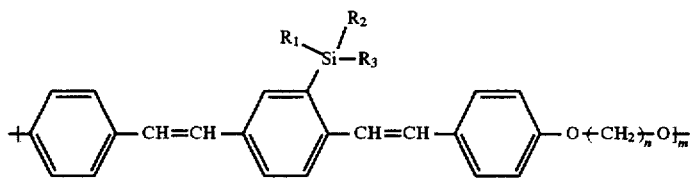

P-2

(3) Synthesis of P-3

Using the same equivalent of monomers (X) and (XIII), the same processes as in (1) are repeated to obtain the final product P-3.

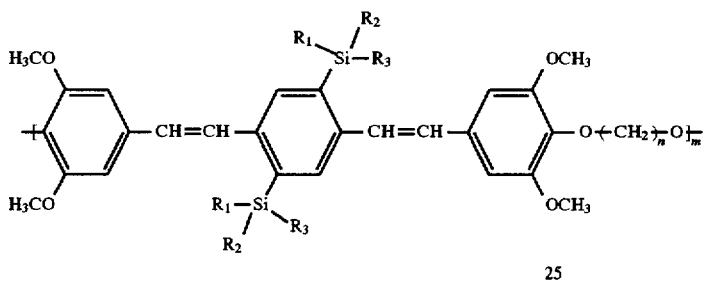

P-3

(4) Synthesis of P-4

Using the same equivalent of monomers (XI) and (XIII), the same processes as in (1) are repeated to obtain the final product P-4.

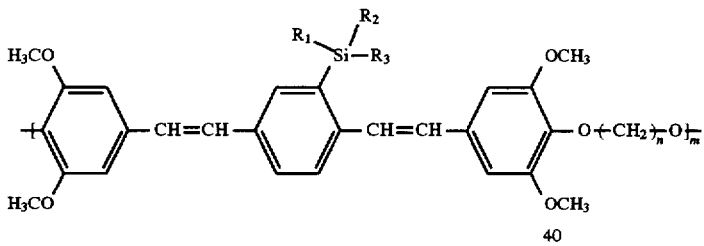

P-4

LED Preparation

Figure 1:
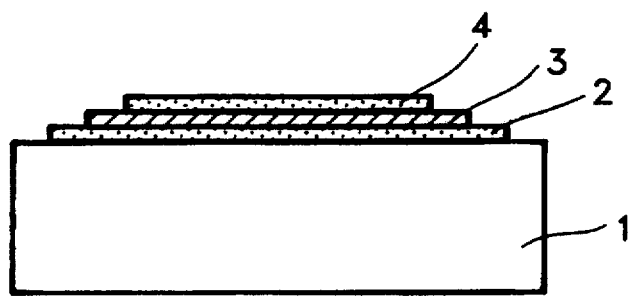
FIG. 1 is a schematic cross-sectional view showing the general light-emitting diode.
Figure 2:
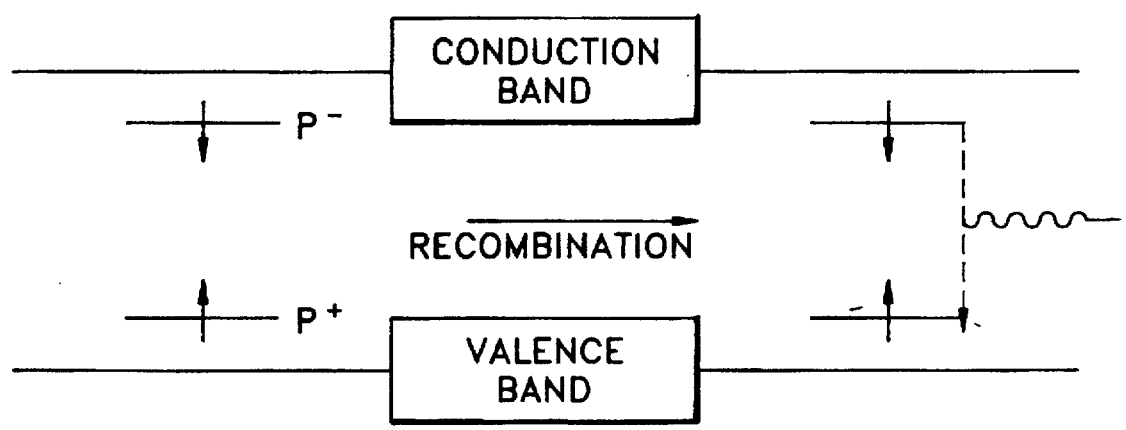
FIG. 2 is a schematic diagram showing a light-emitting process when an electrical field is applied to the light-emitting diode in FIG. 1.

Using the polymers synthesized according to the present invention, a light-emitting diode with a metal-semiconductor-metal structure shown in FIG. 1 is prepared. The anode of the light-emitting diode is made of a material such as gold, platinum or indium tin oxide, each having a high work function. Also, the cathode is made of a material such as aluminum, magnesium or calcium, each having a relatively low work function.

Here, at least one electrode should be transparent, for the efficient transmission of the emitted light.

Hereinafter, the present invention will be described in detail with examples. It should be appreciated that the present invention is in no way limited to these examples.

Synthesis of Monomers

1) Synthesis of 2,5-bis(trimethylsilyl)-1,4-xylenebis (triphenylphosphonium bromide)

7.4 g of 2,5-bis(trimethylsilyl)-1,4-bis(bromomethyl) benzene and 4.3 g of triphenylphosphine were reacted for 24 hours in 30 ml of DMF. The reaction mixture was precipitated in diethylether to obtain a white precipitate. After filtration and vacuum drying the precipitate, the final product (X-1) was obtained. The product yield was 89%.

m.p.: 299°–300° C. $^1$-NMR (DMSO-$d_6$): δ 7.94–7.55 (m, 30H), 7.05 (s, 2H), 5.01 (d, 4H), –0.31 (s, 18H). Element analysis: calculated (C: 64.35%, H: 5.79%); found (C: 63.01%, H: 6.04%)

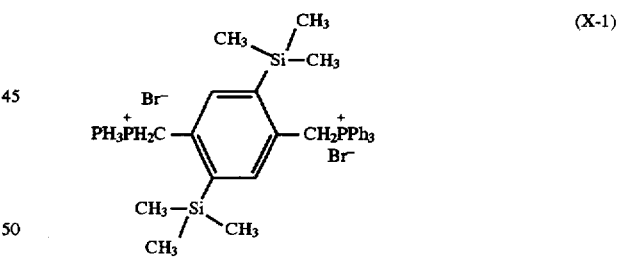

(X-1)

2) Synthesis of 2-trimethylsilyl-1,4-xylenebis triphenylphosphonium bromide)

3.0 g of 2-trimethylsilyl-1,4-bis(bromomethyl)benzene and 5.2 g of triphenylphosphine were reacted for 24 hours in 30 ml of DMF. The reaction mixture was precipitated in diethylether to obtain a white precipitate. After filtration and vacuum drying the precipitate, the white final product (XI-1) was obtained. The product yield was 80%.

m.p.: 233°–235° C. $^1$H-NMR (DMSO-$d_6$): δ 7.91–7.49 (m, 30H), 7.25 (s, 1H), 6.78 (d, 1H), 6.65 (d, 1H), 5.80 (d, 2H), 5.01 (d, 2H), –0.15 (s, 9H). Element analysis: calculated (C: 65.56%, H: 5.36%); found (C: 61.85%, H: 5.33%)

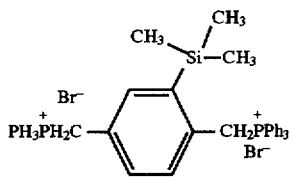

(XI-1)

3) Synthesis of 1,3-bis(4-formyl-phenoxy)propane 10.0 g of 4-hydroxybenzaldehyde and 8.3 g of 1,3-dibromopropane were reacted for 24 hours in 6.2 g of potassium carbonate solution in 100 ml of DMF under reflux. The reaction mixture was poured into cold distilled water to obtain a precipitate. After filtration and vacuum drying the precipitate, the resultant was recrystallized in ethanol to obtain the white product (XII-1). The product yield was 76%.

m.p.: 129°–130° C. $^1$H-NMR (200 MHz, CDCl$_3$): δ 9.80 (s, 2H), 7.79 (d, 4H), 6.83 (d, 4H), 4.22 (t, 4H), 2.30 (q, 2H). $^{13}$C-NMR (CDCl$_3$): δ 190.7, 163.7, 131.9, 130.0, 114.6, 64.4, 28.8. Element analysis: calculated (C: 71.82%, H: 5.67%); found (C: 70.43%, H: 5.60%)

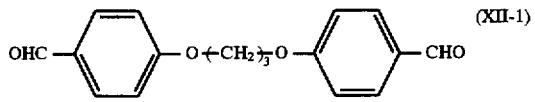

(XII-1)

4) Synthesis of 1,5-bis(4-formyl-2,6-dimethoxyphenoxy)pentane 10.0 g of 4-hydroxybenzaldehyde and 6.3 g of 1,5-dibromopentane were reacted for 24 hours in 6.2 g of potassium carbonate solution in 100 ml of DMF under reflux. The reaction mixture was poured into cold distilled water to obtain a precipitate. After filtration and vacuum drying the precipitate, the resultant was recrystallized in ethanol to obtain the white product (XIII-1). The product yield was 60%.

$^1$H-NMR (200 MHz, CDCl$_3$): δ 9.82 (s, 2H), 7.08 (s, 2H), 4.05 (t, 4H), 3.86 (s, 12H), 1.93–1.71 (m, 4H), 1.61 (m, 2H). Element analysis: calculated (C: 71.82%, H: 5.67%); found (C: 70.43%, H: 5.60%)

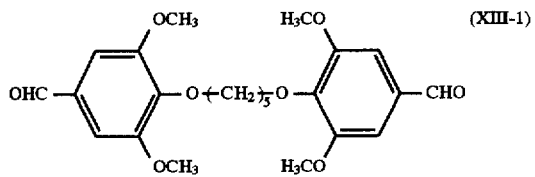

(XIII-1)

[EXAMPLE 1]

Synthesis of Polymer 3.28 g of 2,5-bis(trimethylsilyl)-1,4-xylenebis(triphenyl phosphonium bromide) (X-1) and 1.00 g of 1,3-bis(4-formylphenoxy)propane (XII-1), each being the same equivalent, were thoroughly dissolved in 20 ml of mixed solvent of ethanol and chloroform, and 0.6 g of sodium ethoxide was added. The resulting solution was reacted for 24 hours. After extraction with chloroform, water was removed and precipitated in methanol to synthesize poly[1,3-propanedioxy-1,4-phenylene-1,2-ethylene-(2,5-bis(trimethylsilyl)-1,4-phenylene)-1,2-ethenylene-1,4-phenylene] (P-1-1).

By using polystyrene as the calibration standard, the molecular weight of the obtained P-1-1 was measured. As shown in Table 1, the number average molecular weight of the P-1-1 is 2,100 and the weight average molecular weight thereof is 7,200. The P-1-1 is excited with a xenon lamp as an excitation light source. The excitation wavelength is 330 nm. The photoluminescence (PL) spectra of the polymer (P-1-1) was obtained using a Perkin Elmer LS-50 fluorometer adopting a lock-in amplifier system with chopping frequency of 150 Hz. The polymer (P-1-1) shows its emission in the blue region and the PL spectra thereof are shown in Table 1.

Figure 3:
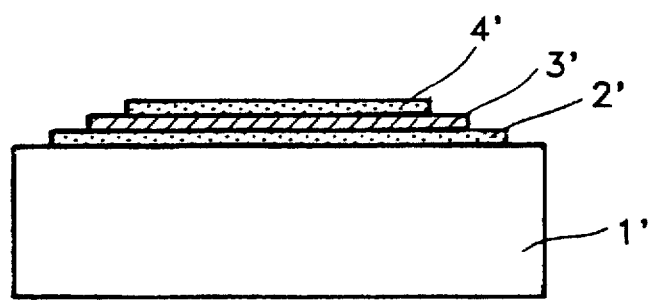
FIG. 3 is a schematic cross-sectional view showing the blue light-emitting polymer diode invention.

LED Manufacture 1.2 g of the obtained P-1-1 was dissolved in 12 ml of cyclohexanone and filtered with a microfilter to remove dust. Then, an ITO layer 2' formed on the substrate 1' was cleaned by ultrasonicator and spin-coated with the above solution while rotating the substrate for 15 seconds at a rate of 4,000 rpm to form a polymeric layer 3' with a thickness of 140 nm. Aluminum was vacuum deposited on the polymeric layer to form a round electrode 4' with a diameter of 5 mm, to thereby complete the fabrication of a light-emitting diode of the present invention (FIG. 3).

Spectroscopic measurement was performed using a dual grating monochrometer (Spex 270M) with a photomultiplier tube (Hammatzu R955) as a detector while applying voltage of 25V into the manufactured light-emitting diode through each electrode. The spectra were recorded by the measurement the light emitted from the aluminum electrode to the ITO electrode, which shows emission in blue region, that is, the wave length is 470 nm. The results are shown in Table 1.

[EXAMPLE 2]

Example 1 was repeated except 3.02 g of 2-trimethylsilyl-1,4-xylenebis(triphenylphosphonium bromide) (XI-1) and 1.00 g of 1,3-bis(4-formyl-phenoxy)propane (XII-1) were used, to synthesize poly[1,3-propanedioxy-1,4-phenylene-1,2-ethenylene-(2-trimethylsilyl-1,4-phenylene)-1,2-ethenylene-1,4-phenylene] (P-2-1).

According to the same method as in Example 1, molecular weight and PL spectra of the P-2-1 were measured. Then, the light-emitting diode adopting the p-2-1 was manufactured and its EL spectra were recorded. The results are shown in Table 1.

[EXAMPLE 3]

Example 1 was repeated except 2.14 g of 2,5-bis(trimethylsilyl)-1,4-xylenebis(triphenylphosphonium bromide) (X-1) and 1.00 g of 1,5-bis(4-formyl-2,6-dimethylphenoxy)pentane (XIII-1) were used, to synthesize poly [1,5-propanedioxy-(2,6-dimethoxy-1,4-phenylene)-1,2-ethenylene-(2,5-bis(trimethylsilyl-1,4-phenylene)-1,2-ethenylene-(3,5-dimethoxy-1,4-phenylene] (P-3-1).

According to the same method as in Example 1, molecular weight and PL spectra of the P-3-1 were measured. Then, the light-emitting diode adopting the P-3-1 was manufactured and its EL spectra were recorded. The results are listed in Table 1.

[EXAMPLE 4]

Example 1 was repeated except 2.00 g of 2-trimethylsilyl-1,4-xylenebis(triphenylphosphonium bromide) (XI-1) and 1.00 g of 1,5-bis(4-formyl-2,6-dimethoxyphenoxy)pentane (XIII-1) were used, to synthesize poly [1,5-propanedioxy-(2,6-dimethoxy-1,4-phenylene)-1,2-ethenylene-(2-dimethylsilyl-1,4-phenylene)-1,2-ethenylene-(3,5-dimethoxy-1,4-phenylene] (P-4-1).

According to the same method as in Example 1, molecular weight and PL spectra of the P-4-1 were measured. Then, the light-emitting diode adopting the P-4-1 was manufactured and its EL spectra were recorded. The results are listed in Table 1.

TABLE 1

| polymer | Mn | Mw | poly-dispersity | PL | EL |
|---------|------|--------|------|---------|-----|
| P-1-1 | 2,100 | 7,200 | 3.5 | 490,467 | 470 |
| P-2-1 | 6,900 | 13,000 | 1.9 | 481,455 | 465 |
| P-3-1 | 2,700 | 7,200 | 2.7 | 490 | 470 |
| P-4-1 | 3,300 | 5,800 | 1.8 | 480 | 470 |

Mn: number-average molecular weight
Mw: weight-average molecular weight
PL: photoluminescence wavelength
EL: electroluminescence wavelength As shown above, the polymers according to the present invention have blue light-emitting properties and a good solubility in organic solvent, whereby the blue light-emitting diodes adopting the same has an excellent light-emitting efficiency.

What is claimed is:

1. A blue light-emitting polymer of which weight average molecular weight is 5,000~30,000, represented as following formula (IV):

$$+X-CH=CH-Y-CH=CH-Z-O+CH_2\unicode{x2192}_n O\unicode{x2192}_m \qquad (IV)$$

wherein X is one selected from the group consisting of the following formulae (V) and (VI); Y is one selected from the group consisting of the following formulae (VII) and (VIII); Z is one selected from the group consisting of the following formulae (V) and (IX); n is 1~20; and m is 5~100;

(V) — phenylene (VI) — dimethoxyphenylene (H$_3$CO, H$_3$CO)

(VII) — bis-silyl phenylene with R$_1$, R$_2$, R$_3$ groups on two Si atoms (VIII) — silyl phenylene with R$_1$, R$_2$, R$_3$ groups on one Si atom (IX) — dimethoxyphenylene (OCH$_3$, OCH$_3$)

where R$_1$, R$_2$ and R$_3$ are each a C$_1$-C$_8$ alkyl group.

2. A blue light-emitting diode comprising a cathode layer, an anode layer and a polymer layer formed between said two electrode layers, wherein said polymer layer includes a conjugated polymer represented as following formula (IV):

$$+X-CH=CH-Y-CH=CH-Z-O+CH_2\unicode{x2192}_n O\unicode{x2192}_m \qquad (IV)$$

wherein X is one selected from the group consisting of the following formulae (V) and (VI); Y is one selected from the group consisting of the following formulae (VII) and (VIII); Z is one selected from the group consisting of the following formulae (V) and (IX); n is 1~20; and m is 5~100;

where R$_1$, R$_2$ and R$_3$ are each a C$_1$-C$_8$ alkyl group.

3. A blue light-emitting diode as claimed in claim 2, wherein the anode is made of one material selected from the group consisting of gold, platinum and ITO.

4. A blue light-emitting diode as claimed in claim 2, wherein the cathode is made of one material selected from the group consisting of aluminum, magnesium and calcium.

5. A blue light-emitting diode as claimed in claim 2, wherein said n is 2-5.

6. A blue light-emitting diode as claimed in claim 2, wherein said R$_1$, R$_2$ and R$_3$ are each a C$_1$-C$_4$ alkyl group.

7. A blue light-emitting diode as claimed in claim 2, wherein at least one of said electrode layers is transparent.

* * * * *

UNITED STATES PATENT AND TRADEMARK OFFICE
CERTIFICATE OF CORRECTION

PATENT NO. : 5,731,599
DATED : March 24, 1998
INVENTOR(S) : Do-hoon HWANG et al.

It is certified that error appears in the above-identified patent and that said Letters Patent is hereby corrected as shown below:

On the title page, item [73] should read as follows:

Assignee: Samsung Electronics Co., Ltd.,
                   Suwon-city, Kyungki-do, Republic of Korea - -.

Signed and Sealed this

Thirteenth Day of July, 1999

*Attest:*

Q. TODD DICKINSON

*Attesting Officer*  *Acting Commissioner of Patents and Trademarks*